United States Patent [19]
Park

[11] Patent Number: 5,502,681
[45] Date of Patent: Mar. 26, 1996

[54] COLUMN START SIGNAL GENERATION CIRCUIT FOR MEMORY DEVICE

[75] Inventor: Chun S. Park, Choongchungbook, Rep. of Korea

[73] Assignee: LG Semicon Co., Ltd., Choongchungbook, Rep. of Korea

[21] Appl. No.: 428,987

[22] Filed: Apr. 26, 1995

[30] Foreign Application Priority Data

Apr. 30, 1994 [KR] Rep. of Korea .................. 9561/1994

[51] Int. Cl.[6] .................................................. G11C 7/02
[52] U.S. Cl. ..................... 365/210; 365/191; 365/207
[58] Field of Search ................................. 365/191, 207, 365/210

[56] References Cited

U.S. PATENT DOCUMENTS 5,325,337  6/1994  Buttar ........................................ 365/210
5,335,198  8/1994  Van Buskirk et al. ................... 365/210

Primary Examiner—David C. Nelms
Assistant Examiner—F. Niranjan
Attorney, Agent, or Firm—Lowe, Price, LeBlanc & Becker

[57] ABSTRACT

A column start signal generation circuit for a memory device, comprising a dummy data storage unit including a plurality of dummy cells for storing dummy data, each of the plurality of dummy cells being connected to a corresponding one of a plurality of word lines and a first dummy bit line or a second dummy bit line, the second dummy bit line being complementary to the first dummy bit line, a dummy data generator for outputting the dummy data to the plurality of dummy cells in the dummy data storage unit in response to a state of a write signal inputted therein, a sense amplification circuit for amplifying the dummy data from one of the plurality of dummy cells in the dummy data storage unit connected to an enabled one of the plurality of word lines, and a sense amplification sensor for sensing a level of an output signal from the sense amplification circuit and outputting a column start signal in accordance with the sensed result.

7 Claims, 3 Drawing Sheets

COLUMN START SIGNAL GENERATION CIRCUIT FOR MEMORY DEVICE

BACKGROUND OF THE INVENTION

1. Field of the Invention

The present invention relates in general to column start signal generation circuits for memory devices, and more particularly to a column start signal generation circuit for a memory device which is capable of storing dummy data into a dummy cell, sensing an output level of a sense amplifier when the dummy data read from the dummy cell is amplified and outputted by the sense amplifier and generating a column start signal at the moment that the sensed level becomes a desired level, so as to enhance an operating speed of the memory device.

2. Description of the Prior Art

Generally, in reading data stored in a memory cell of a memory device, a column start signal is used as one of drive signals to a column switch (Y switch) which transfers the data read from the memory cell to an output buffer.

Referring to FIG. 1, there is shown a schematic block diagram of a conventional column start signal generation circuit for a memory device. As shown in this drawing, the conventional column start signal generation circuit comprises a delay part 1 for delaying a sense amplification enable signal SAE inputted therein and outputting the delayed sense amplification enable signal as a column start signal CS.

When the data is read from the memory cell of the memory device, the column switch generally has an indistinct drive point because it is unknown whether the data read from the memory cell is completely sensed by a sense amplifier.

For this reason, in the conventional column start signal generation circuit, the delay part 1 delays the sense amplification enable signal SAE by an anticipated time margin which is taken for the sense amplifier to completely sense the data read from the memory cell, so as to generate the column start signal CS.

However, in the above-mentioned conventional column start signal generation circuit, when the anticipated time margin is smaller than an actual margin, the sense amplifier is not operated sufficiently, resulting in generation of a small voltage difference between a true bit line and a complementary bit line connected to the sense amplifier. Such a small voltage difference between the true bit line and the complementary bit line results in a faulty operation of the sense amplifier such as an output inversion.

On the other hand, in the case where the anticipated time margin is larger than the actual margin, the column start signal CS is too late generated from the delay part 1 and the column switch is driven late to that extent. This results in a degradation in an operating speed of the memory device.

SUMMARY OF THE INVENTION

Therefore, the present invention has been made in view of the above problems, and it is an object of the present invention to provide a column start signal generation circuit for a memory device which is capable of storing dummy data into a dummy cell, sensing an output level of a sense amplifier when the dummy data read from the dummy cell is amplified and outputted by the sense amplifier and generating a column start signal at the moment that the sensed level becomes a desired level, so as to prevent inversion in output data and enhance an operating speed of the memory device.

In accordance with the present invention, the above and other objects can be accomplished by a provision of a column start signal generation circuit for a memory device, comprising dummy data storage means including a plurality of dummy cells for storing dummy data, each of the plurality of dummy cells being connected to a corresponding one of a plurality of word lines and a first dummy bit line or a second dummy bit line, the second dummy bit line being complementary to the first dummy bit line; dummy data generation means for outputting the dummy data to the plurality of dummy cells in the dummy data storage means in response to a state of a write signal inputted therein; sense amplification means for amplifying the dummy data from one of the plurality of dummy cells in the dummy data storage means connected to an enabled one of the plurality of word lines; and sense amplification sensing means for sensing a level of an output signal from the sense amplification means and outputting a column start signal in accordance with the sensed result.

BRIEF DESCRIPTION OF THE DRAWINGS

The above and other objects, features and advantages of the present invention will be more clearly understood from the following detailed description taken in conjunction with the accompanying drawings, in which:

FIGS. 3A–C show detailed circuit diagrams of main components in FIG. 2, wherein:

FIG. 3A is a detailed circuit diagram of a dummy data generator;

FIG. 3B is a detailed circuit diagram of a sense amplification sensor; and

FIG. 3C is a detailed circuit diagram of a sense level adjustor in FIG. 3B in accordance with an alternative embodiment of the present invention.

DETAILED DESCRIPTION OF THE PREFERRED EMBODIMENTS

Figure 1:
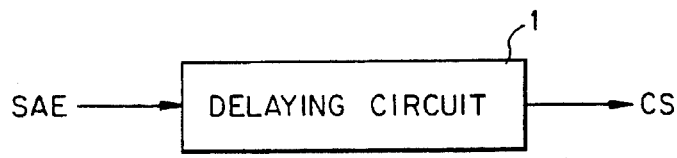
FIG. 1 is a schematic block diagram of a conventional column start signal generation circuit for a memory device.
Figure 2:
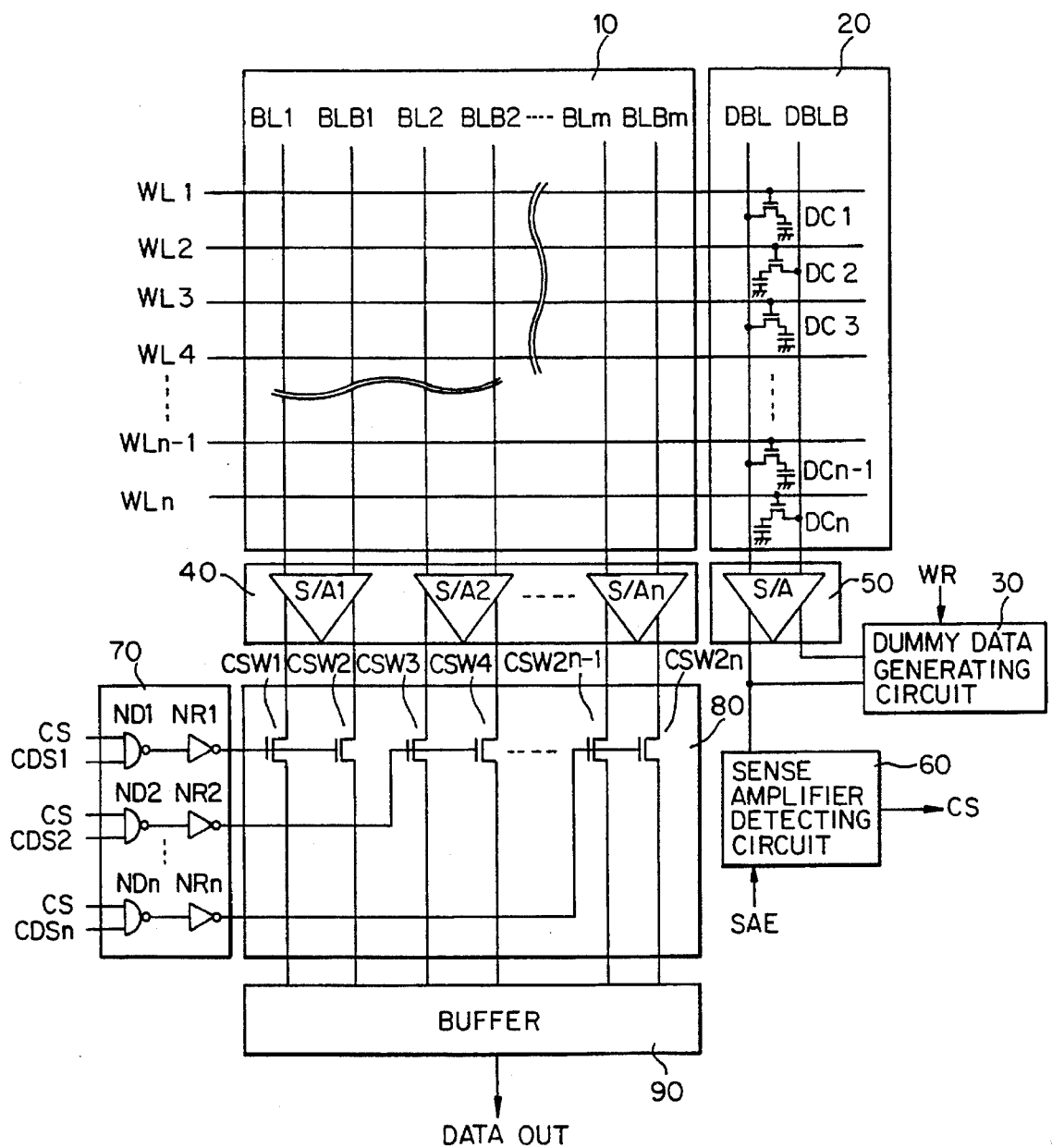
FIG. 2 is a schematic circuit diagram of a column start signal generation circuit for a memory device in accordance with an embodiment of the present invention.

Referring to FIG. 2, there is shown a schematic circuit diagram of a column start signal generation circuit for a memory device in accordance with an embodiment of the present invention. As shown in this drawing, the column start signal generation circuit comprises a memory unit 10 including a plurality of memory cells (not shown) for storing data. Each of the plurality of memory cells is connected to a corresponding one of a plurality of word lines WL1-WLn, a corresponding one of a plurality of true bit lines BL1-BLn and a corresponding one of a plurality of complementary bit lines BLB1-BLBn.

The column start signal generation circuit further comprises a dummy data storage unit 20 including a plurality of dummy cells DC1-DCn for storing dummy data. Each of the dummy cells DC1-DCn-1 is connected to a corresponding one of the plurality of word lines WL1-WLn and a first dummy bit line DBL. Each of the dummy cells DC2-DCn is connected to a corresponding one of the plurality of word lines WL1-WLn and a second dummy bit line DBLB, which is complementary to the first dummy bit line DBL.

The column start signal generation circuit further comprises a dummy data generator 30 for outputting the dummy data to the plurality of dummy cells DC1-DCn in the dummy data storage unit 20 in response to a state of a write signal WR from a read/write control circuit (not shown), and a first sense amplification circuit 40 including a plurality of sense amplifiers S/A1-S/An. Each of the plurality of sense amplifiers S/A1-S/An is adapted to amplify the data from a corresponding one of the memory cells in the memory unit 10.

The column start signal generation circuit further comprises a second sense amplification circuit 50 for amplifying the dummy data from a selected one of the plurality of dummy cells DC1-DCn in the dummy data storage unit 20, a sense amplification sensor 60 for sensing a level of an output signal from the second sense amplification circuit 50 and outputting a column start signal CS in accordance with the sensed result, and a logic circuit 70 including a plurality of NAND gates ND1-NDn and a plurality of NOR gates NR1-NRn. Each of the plurality of NAND gates ND1-NDn is adapted to input the column start signal CS from the sense amplification sensor 60 and a corresponding one of output signals CDS1-CDSn from a column decoder (not shown) and NAND the inputted signals. Each of the plurality of NOR gates NR1-NRn is connected to a corresponding one of the plurality of NAND gates ND1-NDn to invert an output signal therefrom and output the inverted signal as a switching control signal.

The column start signal generation circuit further comprises a column switching circuit 80 for transferring an output signal from the first sense amplification circuit 40 in response to an output signal from the logic circuit 70, and a buffer 90 for buffering an output signal from the column switching circuit 80. The column switching circuit 80 includes a plurality of pairs of column switches CSW1 and CSW2-CSW2n-1 and CSW2n, each of which is connected to a corresponding one of the plurality of sense amplifiers S/A1-S/An in the first sense amplification circuit 40.

Figure 3A:
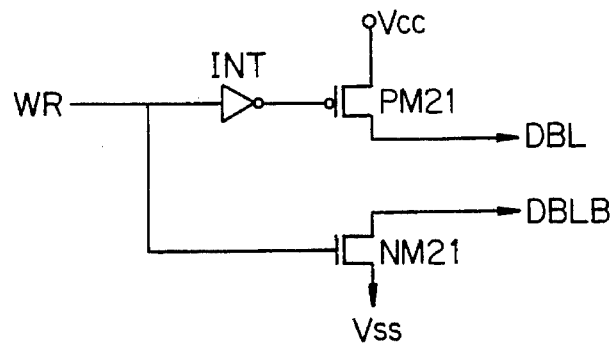

Referring to FIG. 3A, there is shown a detailed circuit diagram of the dummy data generator 30 in FIG. 2. As shown in this drawing, the dummy data generator 30 includes an inverter INT, a PMOS transistor PM21 and an NMOS transistor NM22. The inverter INT is adapted to invert the write signal WR from the read/write control circuit. The PMOS transistor PM21 has a gate for inputting an output signal from the inverter INT, a source for inputting a supply voltage Vcc of high level and a drain connected to the first dummy bit line DBL. The NMOS transistor NM22 has a gate for inputting the write signal WR from the read/write control circuit, a source for inputting a supply voltage Vss of low level and a drain connected to the second dummy bit line DBLB.

Figure 3B:
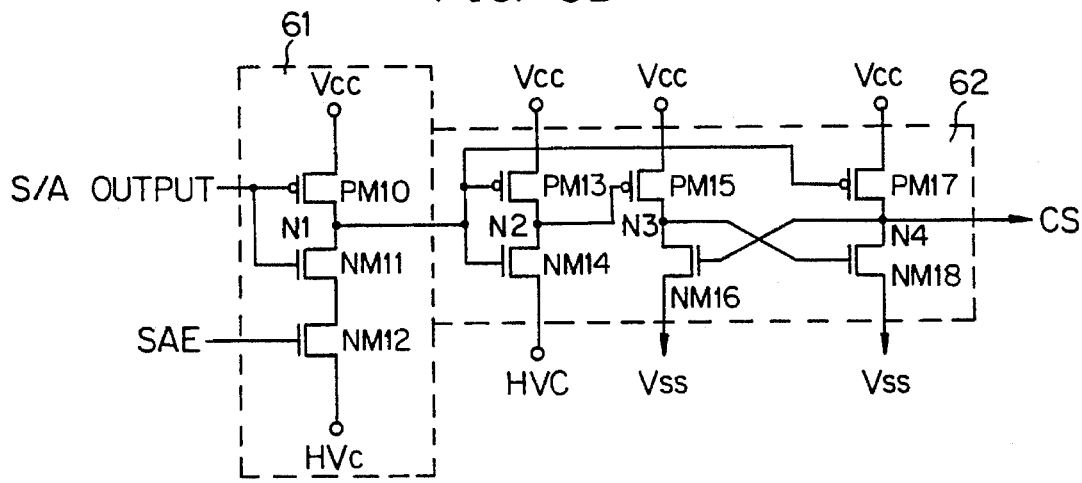

Referring to FIG. 3B, there is shown a detailed circuit diagram of the sense amplification sensor 60 in FIG. 2. As shown in this drawing, the sense amplification sensor 60 includes a sense level adjustor 61 for sensing the level of the output signal from the second sense amplification circuit 50, and a level shifter 62 for varying a level of an output signal from the sense level adjustor 61.

The sense level adjustor 61 includes a PMOS transistor PM10 and NMOS transistors NM11 and NM12. The PMOS transistor PM10 has a gate for inputting the output signal from the second sense amplification circuit 50, a source for inputting the supply voltage Vcc of high level and a drain connected to a common node N1. The NMOS transistor NM11 has a gate for inputting the output signal from the second sense amplification circuit 50, a drain connected to the common node N1 and a source connected to a drain of the NMOS transistor NM12. The NMOS transistor NM12 has a gate for inputting a sense amplification enable signal SAE and a source for inputting a supply voltage HVC of half level. The drain of the NMOS transistor NM12 is connected to the source of the NMOS transistor NM11.

The level shifter 62 includes PMOS transistors PM13, PM15 and PM17 and NMOS transistors NM14, NM16 and NM18. The PMOS transistor PM13 has a gate connected to the common node N1, a source for inputting the supply voltage Vcc of high level and a drain connected to a common node N2. The NMOS transistor NM14 has a gate connected to the common node N1, a source for inputting the supply voltage HVC of half level and a drain connected to the common node N2. The PMOS transistor PM15 has a source for inputting the supply voltage Vcc of high level, a gate connected to the common node N2 and a drain connected to a common node N3. The NMOS transistor NM16 has a source for inputting the supply voltage Vss of low level, a drain connected to the common node N3 and a gate connected to a common node N4. The PMOS transistor PM17 has a source for inputting the supply voltage Vcc of high level, a gate connected to the common node N1 and a drain connected to the common node N4. The NMOS transistor NM18 has a gate connected to the common node N3, a source for inputting the supply voltage Vss of low level and a drain connected to the common node N4.

The operation of the column start signal generation circuit with the above-mentioned construction in accordance with the embodiment of the present invention will hereinafter be described in detail.

First, the write signal WR from the read/write control circuit is applied to the dummy data generator 30. In the dummy data generator 30, as shown in FIG. 3A, the write signal WR from the read/write control circuit is inverted by the inverter INT and then applied to the gate of the PMOS transistor PM21. In the case where the write signal WR from the read/write control circuit is high in level, the PMOS transistor PM21 is turned on to transfer the supply voltage Vcc of high level to the first dummy bit line DBL through its drain. The write signal WR of high level from the read/write control circuit is also applied to the gate of the NMOS transistor NM22, thereby causing the NMOS transistor NM22 to be turned on. As being turned on, the NMOS transistor NM22 transfers the supply voltage Vss of low level to the second dummy bit line DBLB through its drain.

As a result, in the dummy data storage unit 20, the supply voltage Vcc of high level is stored in the dummy cells DC1-DCn-1 connected to the corresponding ones of the plurality of word lines WL1-WLn and the first dummy bit line DBL. Also, the supply voltage Vss of low level is stored in the dummy cells DC2-DCn connected to the corresponding ones of the plurality of word lines WL1-WLn and the second dummy bit line DBLB.

Under the condition that the dummy data is stored in the plurality of dummy cells DC1-DCn in the dummy data storage unit 20, one of the plurality of word lines WL1-WLn is selected in response to a corresponding one of word line select signals WLS1-WLSn (not shown) from an address decoder (not shown) and a word line enable signal WLE (not shown) from a pulse generator (not shown). Then, the data is read from one of the plurality of memory cells in the memory unit 10 connected to the selected word line WL.

The data read from the memory cell is amplified by the corresponding one of the plurality of sense amplifiers S/A1-S/An in the first sense amplification circuit 40 and then transferred to the column switching circuit 80.

Also, the dummy data is read from one of the plurality of dummy cells DC1-DCn in the dummy data storage unit 20 connected to the first dummy bit line DBL or the second dummy bit line DBLB and the word line WL which is selected in response to the corresponding one of the word line select signals WLS1-WLSn from the address decoder and the word line enable signal WLE from the pulse generator. The dummy data from the dummy cell DC is amplified by the second sense amplification circuit 50 and then applied as shown in FIG. 4A to the sense amplification sensor 60.

Figure 4A:
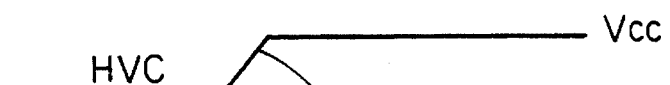
FIGS. 4A to 4D are timing diagrams of input and output signals in the sense amplification sensor.

In the sense level adjustor 61 of the sense amplification sensor 60, the output signal from the second sense amplification circuit 50 as shown in FIG. 4A is applied in common to the gates of the PMOS transistor PM10 and the NMOS transistor NM11. Also, the sense amplification enable signal SAE as shown in FIG. 4B is applied to the gate of the NMOS transistor NM12.

Figure 4B:

In the case where the output signal from the second sense amplification circuit 50 has the supply voltage HVC of half level (i.e., HVC=½ Vcc) as shown in FIG. 4A and the sense amplification enable signal SAE has the supply voltage Vss of low level as shown in FIG. 4B, the PMOS transistor PM10 and the NMOS transistor NM11 are turned on, whereas the NMOS transistor NM12 is turned off. As a result, the supply voltage Vcc of high level appears at the output node N1.

Noticeably, the NMOS transistor NM12 functions to suppress the generation of the column start signal CS until the sense amplification enable signal SAE is applied to the gate thereof.

On the other hand, in the case where the output signal from the second sense amplification circuit 50 has the supply voltage Vcc of high level as shown in FIG. 4A and the sense amplification enable signal SAE has the supply voltage Vcc of high level as shown in FIG. 4B, the PMOS transistor PM10 is turned off, whereas the NMOS transistors NM11 and NM12 are turned on. As a result, the supply voltage HVC of half level appears at the output node N1. In result, the signal at the output node N1 as shown in FIG. 4C is applied to the level shifter 62.

Figure 4C:

In the level shifter 62, when the signal at the output node N1 has the supply voltage Vcc of high level as shown in FIG. 4C, the PMOS transistors PM13 and PM17 are turned off, whereas the NMOS transistor NM14 is turned on. As a result, the supply voltage HVC of half level at the output node N2 is applied to the gate of the PMOS transistor PM15, thereby causing the PMOS transistor PM15 to be turned on. As being turned on, the PMOS transistor PM15 transfers the supply voltage Vcc of high level to the gate of the NMOS transistor NM18 through the output node N3. In result, the NMOS transistor NM18 turns on to output the supply voltage Vss of low level through the output node N4.

On the other hand, when the signal at the output node N1 has the supply voltage HVC of half level as shown in FIG. 4C, the PMOS transistors PM13 and PM17 and the NMOS transistor NM14 are turned on, whereas the supply voltage Vct of high level appears at the output node N2. As a result, the PMOS transistor PM15 is turned off, thereby causing the supply voltage Vcc of high level to be outputted through the output node N4.

Figure 4D:

Therefore, the level shifter 62 converts a voltage width (Vcc-HVC) of the output signal from the sense level adjustor 61 as shown in FIG. 4C into a new one (Vss-Vcc) as shown in FIG. 4D. Then, the level shifter 62 outputs the column start signal CS with the new voltage width (Vss-Vcc) to tile logic circuit 70.

In the logic circuit 70, each of the plurality of NAND gates ND1-NDn NANDs the column start signal CS from the sense amplification sensor 60 and the corresponding one of the output signals CDS1-CDSn from the column decoder. Then, each of the plurality of NOR gates NR1-NRn inverts the output signal from the corresponding one of the plurality of NAND gates ND1-NDn and outputs the inverted signal as the switching control signal to the column switching circuit 80.

In the column switching circuit 80, each of the column switches CSW1 and CSW2-CSW2n-1 and CSW2n is turned on in response to the output signal from the logic circuit 70 when both the column start signal CS from the sense amplification sensor 60 and the corresponding one of the output signals CDS1-CDSn from the column decoder are high in level.

As a result, the data from the memory unit 10 amplified by the first sense amplification circuit 40 is transferred to the buffer 90 through the column switching circuit 80. The buffer 90 buffers the input data.

Figure 3C:
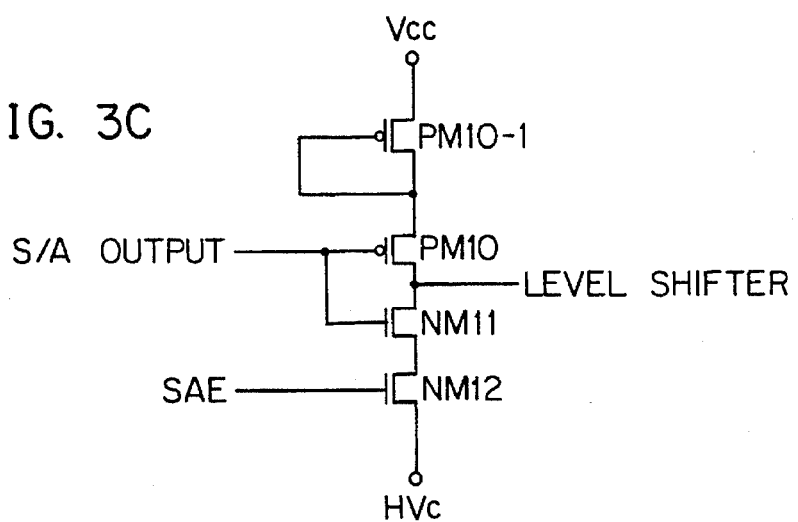

FIG. 3C is a detailed circuit diagram of the sense level adjustor 61 in FIG. 3B in accordance with an alternative embodiment of the present invention. In the alternative embodiment of the present invention, the sense level adjustor 61 includes a PMOS transistor PM10-1 in addition to the construction in FIG. 3B. The PMOS transistor PM10-1 has a gate and a drain connected in common to the source of the PMOS transistor PM10 and a source for inputting the supply voltage Vcc of high level. Therefore, the sense level adjustor 61 can adjust the sense level of the amplified dummy data from the second sense amplification circuit 50 by adjusting a threshold voltage Vt of the PMOS transistor PM10 using the PMOS transistor PM10-1.

As apparent from the above description, according to the present invention, the dummy data from the dummy data generator is stored into the dummy cell. In the data reading operation, the output level of the sense amplifier is sensed when the dummy data read from the dummy cell is amplified and outputted by the sense amplifier. At the moment that the sensed level becomes the desired level, the column start signal is generated. Therefore, the column switch can be driven under the optimum condition with no time delay. This has the effect of preventing inversion in the output of the sense amplifier and enhancing an operating speed of the memory device.

Although the preferred embodiments of the present invention have been disclosed for illustrative purposes, those skilled in the an will appreciate that various modifications, additions and substitutions are possible, without departing from the scope and spirit of the invention as disclosed in the accompanying claims.

What is claimed is:

1. A column start signal generation circuit for a memory device, comprising:

dummy data storage means including a plurality of dummy cells for storing dummy data, each of said plurality of dummy cells being connected to a corresponding one of a plurality of word lines and a first dummy bit line or a second dummy bit line, said second dummy bit line being complementary to said first dummy bit line;

dummy data generation means for outputting the dummy data to said plurality of dummy cells in said dummy data storage means in response to a state of a write signal inputted therein;

sense amplification means for amplifying the dummy data from one of said plurality of dummy cells in said dummy data storage means connected to an enabled one of said plurality of word lines; and sense amplification sensing means for sensing a level of an output signal from said sense amplification means and outputting a column start signal in accordance with the sensed result.

2. A column start signal generation circuit for a memory device, as set forth in claim 1, wherein said dummy data generation means includes:

an inverter for inverting the write signal;

a PMOS transistor having a gate for inputting an output signal from said inverter, a source for inputting a supply voltage and a drain connected to said first dummy bit line; and an NMOS transistor having a gate for inputting the write signal, a source connected to a ground terminal and a drain connected to said second dummy bit line.

3. A column start signal generation circuit for a memory device, as set forth in claim 1, wherein said sense amplification sensing means includes:

sense level adjusting means for sensing the level of the output signal from said sense amplification means; and level shifting means for varying a level of an output signal from said sense level adjusting means.

4. A column start signal generation circuit for a memory device, as set forth in claim 3, wherein said sense level adjusting means includes:

a first PMOS transistor having a gate for inputting the output signal from said sense amplification means and a source for inputting a supply voltage of high level;

a first NMOS transistor having a gate for inputting the output signal from said sense amplification means and a drain connected to a drain of said first PMOS transistor; and a second NMOS transistor having a gate for inputting a sense amplification enable signal, a source for inputting a supply voltage of half level and a drain connected to a source of said first NMOS transistor.

5. A column start signal generation circuit for a memory device, as set forth in claim 3, wherein said level shifting means includes:

a first PMOS transistor having a gate connected to a first common node, a source for inputting a supply voltage of high level and a drain connected to a second common node;

a first NMOS transistor having a gate connected to said first common node, a source for inputting a supply voltage of half level and a drain connected to said second common node;

a second PMOS transistor having a source for inputting the supply voltage of high level, a gate connected to said second common node and a drain connected to a third common node;

a second NMOS transistor having a source for inputting a supply voltage of low level, a drain connected to said third common node and a gate connected to a fourth common node;

a third PMOS transistor having a source for inputting the supply voltage of high level, a gate connected to said first common node and a drain connected to said fourth common node; and a third NMOS transistor having a gate connected to said third common node, a source for inputting the supply voltage of low level and a drain connected to said fourth common node.

6. A column start signal generation circuit for a memory device, as set forth in claim 4, wherein said sense level adjusting means further includes a second PMOS transistor for adjusting a threshold voltage of said first PMOS transistor to adjust a sense level, said second PMOS transistor having a gate and a drain connected in common to the source of said first PMOS transistor and a source for inputting the supply voltage of high level.

7. A column start signal generation circuit for a memory device, as set forth in claim 3, wherein said sense amplification sensing means is adapted to sense the dummy data from one of said plurality of dummy cells in said dummy data storage means connected to said first dummy bit line or said second dummy bit line.

* * * * *